US010809315B2

(12) United States Patent
Zhou et al.

(10) Patent No.: US 10,809,315 B2
(45) Date of Patent: Oct. 20, 2020

(54) CALIBRATION APPARATUS, CALIBRATION METHOD, AND MEASURING SYSTEM

(71) Applicant: General Electric Company, Schenectady, NY (US)

(72) Inventors: Ronghui Zhou, Shanghai (CN); Pekka Tapani Sipila, Garching bei Munchen (DE); Dan Tho Lu, Minden, NV (US); Xu Fu, Shanghai (CN)

(73) Assignee: BAKER HUGHES OILFIELD OPERATIONS LLC, Houston, TX (US)

( * ) Notice: Subject to any disclaimer, the term of this patent is extended or adjusted under 35 U.S.C. 154(b) by 55 days.

(21) Appl. No.: 15/708,455

(22) Filed: Sep. 19, 2017

(65) Prior Publication Data
US 2018/0095144 A1 Apr. 5, 2018

(30) Foreign Application Priority Data

Sep. 30, 2016 (CN) .......................... 2016 1 0873914

(51) Int. Cl.
*G01R 33/00* (2006.01)
*G01L 25/00* (2006.01)
(Continued)

(52) U.S. Cl.
CPC .......... *G01R 33/0035* (2013.01); *G01L 25/00* (2013.01); *G01R 33/0017* (2013.01);
(Continued)

(58) Field of Classification Search
CPC ............ G01R 33/0035; G01R 33/0017; G01R 35/005; G01L 25/00; G01L 3/102; H01L 41/12–125
(Continued)

(56) References Cited

U.S. PATENT DOCUMENTS 4,011,758 A * 3/1977 Reenstra ................... G01L 9/16
310/26
4,989,460 A * 2/1991 Mizuno ................... G01L 3/102
73/862.335
(Continued)

FOREIGN PATENT DOCUMENTS

EP 2 833 109 A1 2/2015

OTHER PUBLICATIONS

Fleming, "Magnetostrictive Torque Sensors—Derivation of Transducer Model", SAE Technical Paper Series, pp. 81-100, 1989.
(Continued)

*Primary Examiner* — Patrick Assouad
*Assistant Examiner* — Demetrius R Pretlow
(74) *Attorney, Agent, or Firm* — Mintz Levin Cohn Ferris Glovsky and Popeo, P.C.

(57) ABSTRACT

A calibration apparatus is configured to calibrate a magnetostrictive sensor. The magnetostrictive sensor is configured to measure an object and comprises a sensing element positioned adjacent to the object. The calibration apparatus comprises an estimation device and a calibrator. The estimation device is configured to estimate at least one of a gap between the sensing element and the object and a temperature of the object to obtain at least one of an estimated gap and an estimated temperature, based on geometric information, an excitation signal and an output signal of the magnetostrictive sensor, and geometric information of the object. The calibrator is configured to reduce an effect on the output signal of the magnetostrictive sensor imposed by variations in the at least one of the gap and the temperature, based on the at least one of the estimated gap and the estimated temperature, to obtain a calibrated output signal.

19 Claims, 5 Drawing Sheets

(51) Int. Cl.
*G01R 35/00* (2006.01)
*G01L 1/12* (2006.01)
*G01L 3/00* (2006.01)
*G01P 3/44* (2006.01)

(52) U.S. Cl.
CPC ............ *G01R 35/005* (2013.01); *G01L 1/125* (2013.01); *G01L 3/00* (2013.01); *G01P 3/44* (2013.01)

(58) Field of Classification Search
USPC ........................ 324/202, 225, 207.21, 207.26
See application file for complete search history.

(56) References Cited

U.S. PATENT DOCUMENTS

| | | | | |
|---|---|---|---|---|
| 5,062,062 | A * | 10/1991 | Nishibe | G01D 3/022 702/41 |
| 5,269,178 | A | 12/1993 | Vigmostad et al. | |
| 5,274,328 | A * | 12/1993 | Begin | G01B 7/02 324/202 |
| 5,351,555 | A | 10/1994 | Garshelis | |
| 5,495,774 | A | 3/1996 | Klauber et al. | |
| 6,208,133 | B1 * | 3/2001 | Ehling | G01B 7/003 324/202 |
| 6,351,117 | B1 * | 2/2002 | Ehling | G01B 7/003 324/207.12 |
| 7,533,584 | B1 | 5/2009 | Wahl | |
| 7,997,152 | B2 | 8/2011 | Yamakawa et al. | |
| 8,203,334 | B2 | 6/2012 | Baller et al. | |
| 9,435,708 | B1 * | 9/2016 | Kari | G01L 25/00 |
| 2007/0014506 | A1 * | 1/2007 | Arias Vidal | G01D 5/485 385/13 |
| 2007/0034022 | A1 * | 2/2007 | Bunyer | G01L 3/102 73/862.333 |
| 2007/0107528 | A1 * | 5/2007 | Schroeder | G01B 7/24 73/779 |
| 2010/0088003 | A1 | 4/2010 | Meacham | |
| 2010/0242626 | A1 * | 9/2010 | Weng | G01L 3/102 73/862.333 |
| 2012/0297895 | A1 * | 11/2012 | Kapas | G01L 3/102 73/862.193 |
| 2014/0165737 | A1 | 6/2014 | Brummel et al. | |
| 2014/0184210 | A1 | 7/2014 | Campbell et al. | |
| 2014/0366637 | A1 * | 12/2014 | Brummel | G01B 7/14 73/779 |
| 2016/0363488 | A1 * | 12/2016 | Sipila | G01L 3/102 |
| 2019/0049320 | A1 * | 2/2019 | Lu | G01D 3/0365 |

OTHER PUBLICATIONS

Fleming, "Magnetostrictive Torque Sensors—Analysis of Performance Limits", SAE Technical Paper Series, pp. 101-115, 1989.

Fleming, "Computer-Model Simulation Results for Three Magnetostrictive Torque Sensor Designs", SAE Technical Japer Series, pp. 34, Jan. 2, 1991.

Wallin et al., "Evaluation of Torque Pulses in Industrial Applications Using the Torque Sensor Torductor(R)-S", Sensors for Industry, Proceedings of the First ISA/IEEE Conference, pp. 95-100, 2001.

Sasada et al., "A Torque Sensor Using Magnetostrictive Sleeve Attached to the Shaft by Shrink-Fit", INTERMAG Digests of the IEEE International Magnetics Conference, pp. 435-436, Apr. 4-8, 2005.

"Contact Less Magnetostrictive Torque Sensor", ip.com, https://priorart.ip.com/IPCOM/000204668, Mar. 9, 2011.

Extended European Search Report and Opinion issued in connection with corresponding EP Application No. 17192362.6 dated Feb. 7, 2018.

* cited by examiner

CALIBRATION APPARATUS, CALIBRATION METHOD, AND MEASURING SYSTEM

BACKGROUND

Embodiments of the present disclosure relate generally to calibration apparatuses and calibration methods for calibrating magnetostrictive sensors, and more particularly to measuring systems comprising the calibration apparatus.

A magnetostrictive sensor is a device for measuring a stress or a torque of an object by coupling magnetic flux into subsurface of the object, because magnetic permeability of the object will change with applied stress or torque. Typically, upon receiving an excitation signal, the magnetostrictive sensor generates magnetic flux and induces the magnetic flux into the object. Then the magnetostrictive sensor outputs a signal as an indicator of the stress or the torque. Some critical factors, such as a magnetic gap between the magnetostrictive sensor and the object, a temperature of the object, and runout of the object may influence the signal outputted by the magnetostrictive sensor. Variations in the magnetic gap, the temperature and the runout may bring large errors to final measured results.

The conventional magnetostrictive sensors have a problem of low accuracy which is caused by the variations in the magnetic gap, the temperature or the runout.

Therefore, it is desirable to provide new calibration apparatuses and calibration methods for calibrating the magnetostrictive sensor, and new measuring systems comprising the calibration apparatus, to solve at least one of the above-mentioned problems.

BRIEF DESCRIPTION

In one aspect, a calibration apparatus is configured to calibrate a magnetostrictive sensor, wherein the magnetostrictive sensor is configured to measure an object and comprises a sensing element positioned adjacent to the object. The calibration apparatus comprises an estimation device and a calibrator. The estimation device is configured to estimate at least one of a gap between the sensing element and the object and a temperature of the object to obtain at least one of an estimated gap and an estimated temperature, based on geometric information, an excitation signal and an output signal of the magnetostrictive sensor, and geometric information of the object. The calibrator is configured to reduce an effect on the output signal of the magnetostrictive sensor imposed by variations in the at least one of the gap and the temperature, based on the at least one of the estimated gap and the estimated temperature, to obtain a calibrated output signal.

In another aspect, a measuring system for measuring an object comprises a magnetostrictive sensor, an estimation device, a calibrator and a calculator. The magnetostrictive sensor comprises a sensing element positioned adjacent to the object. The estimation device is configured to estimate at least one of a gap between the sensing element and the object and a temperature of the object to obtain at least one of an estimated gap and an estimated temperature, based on geometric information, an excitation signal and an output signal of the magnetostrictive sensor, and geometric information of the object. The calibrator is configured to reduce an effect on the output signal of the magnetostrictive sensor imposed by variations in the at least one of the gap and the temperature based on the at least one of the estimated gap and the estimated temperature, to obtain a calibrated output signal. The calculator is configured to calculate at least one of a stress, a torque and a rotation speed of the object, based on the calibrated output signal.

In yet another aspect, a calibration method is configured to calibrate a magnetostrictive sensor, wherein the magnetostrictive sensor is configured to measure an object and comprises a sensing element adjacent to the object. The calibration method comprises estimating at least one of a gap between the sensing element and the object and a temperature of the object to obtain at least one of an estimated gap and an estimated temperature, based on geometric information, an excitation signal and an output signal of the magnetostrictive sensor, and geometric information of the object; and reducing an effect on the output signal of the magnetostrictive sensor imposed by variations in the at least one of the gap and the temperature based on the at least one of the estimated gap and the estimated temperature, to obtain a calibrated output signal.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

In an effort to provide a concise description of these embodiments, not all features of an actual implementation are described in one or more specific embodiments. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of the present disclosure.

Unless defined otherwise, technical and scientific terms used herein have the same meaning as is commonly understood by one of ordinary skill in the art to which the present disclosure belongs. The terms "first," "second," "third," "fourth," and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean either any, several, or all of the listed items. The use of "including," "comprising," or "having," and variations thereof herein are meant to encompass the items listed thereafter and equivalents thereof as well as additional items.

Embodiments of the present disclosure refer to a measuring system configured to measure at least one of a stress, a torque and a rotation speed of an object. The measuring system has self-calibration function and can achieve high measuring accuracy.

Figure 1:
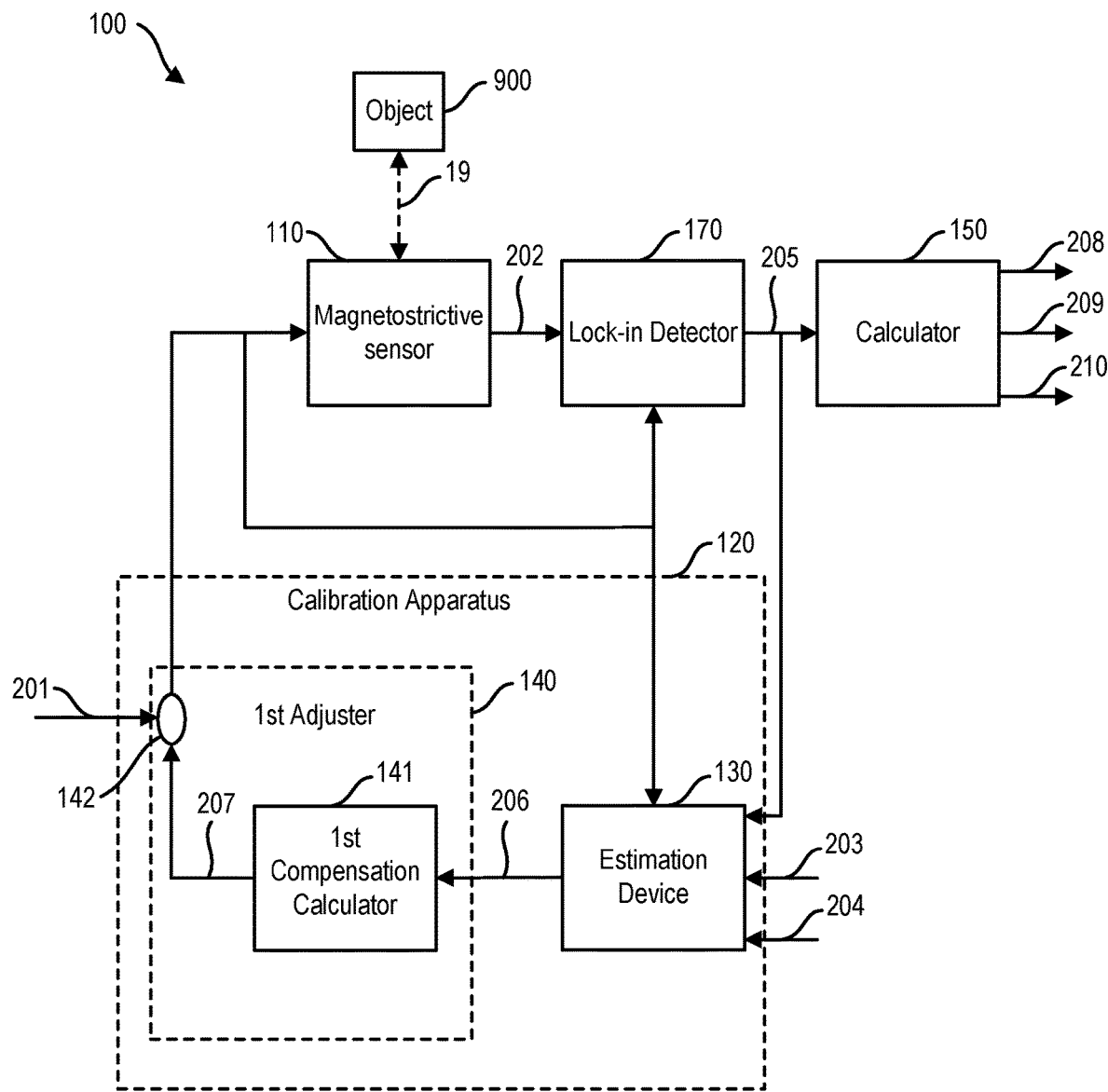
FIG. 1 is a sketch view illustrating a measuring system in accordance with an exemplary embodiment of the present disclosure.

FIG. 1 is a sketch view of a measuring system 100 for measuring an object 900 in accordance with an exemplary embodiment of the present disclosure. Referring to FIG. 1, the measuring system 100 comprises a magnetostrictive sensor 110, a calibration apparatus 120, and a calculator 150.

The magnetostrictive sensor 110 receives an excitation signal 201 for generating magnetic flux and outputs an output signal 202 which indicates a stress and a torque of the objects. The magnetostrictive sensor 110 comprises a sensing element positioned adjacent to the object 900, and there is a gap 19 between the object 900 and the sensing element 110. The object 900 may comprise a shaft, a coupling or a combination thereof, and the object has a temperature. The gap 19 and the temperature may vary during the measuring, which may introduce errors into the output signal 202.

The calibration apparatus 120 is coupled with the magnetostrictive sensor 110 for calibrating the output signal 202 of the magnetostrictive sensor, in order to reduce the errors caused by variations in at least one of the gap and the temperature, and thereby increase the measuring accuracy. As shown in FIG. 1, the calibration apparatus 120 comprises an estimation device 130 and a calibrator 140.

The estimation device 130 is configured to estimate at least one of the gap 19 and the temperature to obtain at least one of an estimated gap and an estimated temperature 206, based on the excitation signal 201 and the output signal 202 of the magnetostrictive sensor 110, geometric information of the object 203, and geometric information of the magnetostrictive sensor 204. The geometric information of the object 203 may comprise at least one of a shape and a size of the object 900. In some embodiments, the object 900 comprises a shaft, and the geometric information 203 comprises a diameter of the shaft. The geometric information of the magnetostrictive sensor 204 may comprise at least one of a size and a shape of the sensing element.

In some embodiments, the excitation signal 201 comprises an alternating excitation signal having a frequency and an amplitude. The output signal 202 comprises an alternating voltage signal, which has an instantaneous amplitude and an instantaneous phase at each moment. The measuring system 100 further comprises a lock-in detector 170 for detecting the instantaneous phase and the instantaneous amplitude of the alternating voltage signal. The lock-in detector 170 receives the excitation signal 201 and the output signal 202 of the magnetostrictive sensor, and outputs the instantaneous amplitude and the instantaneous phase of the output signal. The phase and the amplitude of the output signal are usually referred to as an impedance 205 of the output signal. The estimation device 130 is configured to estimate at least one of an instantaneous gap and an instantaneous temperature based on the frequency and amplitude of the alternating excitation signal, the instantaneous amplitude and the instantaneous phase (i.e.: the instantaneous impedance 205) of the alternating voltage signal, and the geometric information of the object and the sensing element. The alternating excitation signal may comprise an alternating current signal or an alternating voltage signal.

As mentioned above, the estimation device 130 receives the excitation signal 201 and the output signal 202 of the magnetostrictive sensor 110, geometric information of the object 203, and geometric information of the magnetostrictive sensor 204, which are referred to as an estimation input, and outputs at least one of the gap and the temperature, which is referred to as an estimation output. In some embodiments, the estimation device 130 estimates the at least one of the gap 19 and the temperature based on an algorithm. The algorithm refers to a relation between the estimation input and the estimation output. The algorithm may comprise a linear model, a nonlinear model, a physical model-based algorithm, a data-driven algorithm, or any combination thereof. The algorithm may comprise an optimal regression model, a neural network based model, an inversed physical model, an extended kalman filter (EKF), an unscented kalman filter (UKF) or any combination thereof. The EKF or UKF is a nonlinear algorithm configured to estimate required quantities based on physical models, input signals and output signals of a system; wherein the physical mode is built based on electro-magnetic principles and the geometric information of the object and the magnetostrictive sensor. The estimation device 130 may comprise other estimation devices having the similar function.

The calibrator 140 is configured to reduce or even eliminate an effect on the output signal of the magnetostrictive sensor imposed by the variations in the at least one of the gap and the temperature, based on the at least one of the estimated gap and the estimated temperature 206, to obtain a calibrated output signal. The calibrator 140 is able to reduce or eliminate the effect in real time, so that the output signal 202 is substantially independent of any variations in the gap or the temperature.

Continuing referring to FIG. 1, the calibrator 140 comprises a first adjuster for adjusting the excitation signal 201 based on the at least one of the estimated gap and the estimated temperature 206. Specifically, the first adjuster 140 comprises a first compensation calculator 141 and a first compensator 142. The first compensation calculator 141 is configured to calculate an excitation signal compensation 207 based on the at least one of the estimated gap and the estimated temperature 206, and the first compensator 142 is configured to compensate the excitation signal 201 according to the excitation signal compensation 207. In some embodiments, the excitation signal compensation 207 comprises an amplitude compensation and a frequency compensation. The first compensator 142 compensates the amplitude and the frequency of the excitation signal respectively according to the amplitude compensation and the frequency compensation. In some embodiments, the first compensator 142 comprises an adder or a subtractor.

The calculator 150 is configured to calculate at least one of a stress 208 and a torque 209 of the object based on the calibrated output signal. In some embodiments, the object is rotating during the measuring. The calculator 150 is also configured to calculate a rotation speed 210 of the rotating object based on the calibrated output signal. In the embodiment shown in FIG. 1, the calculator 150 is configured to calculate the stress 208, the torque 209 and the rotation speed 210 of the object based on the impedance 205 of the calibrated output signal.

Figure 2:
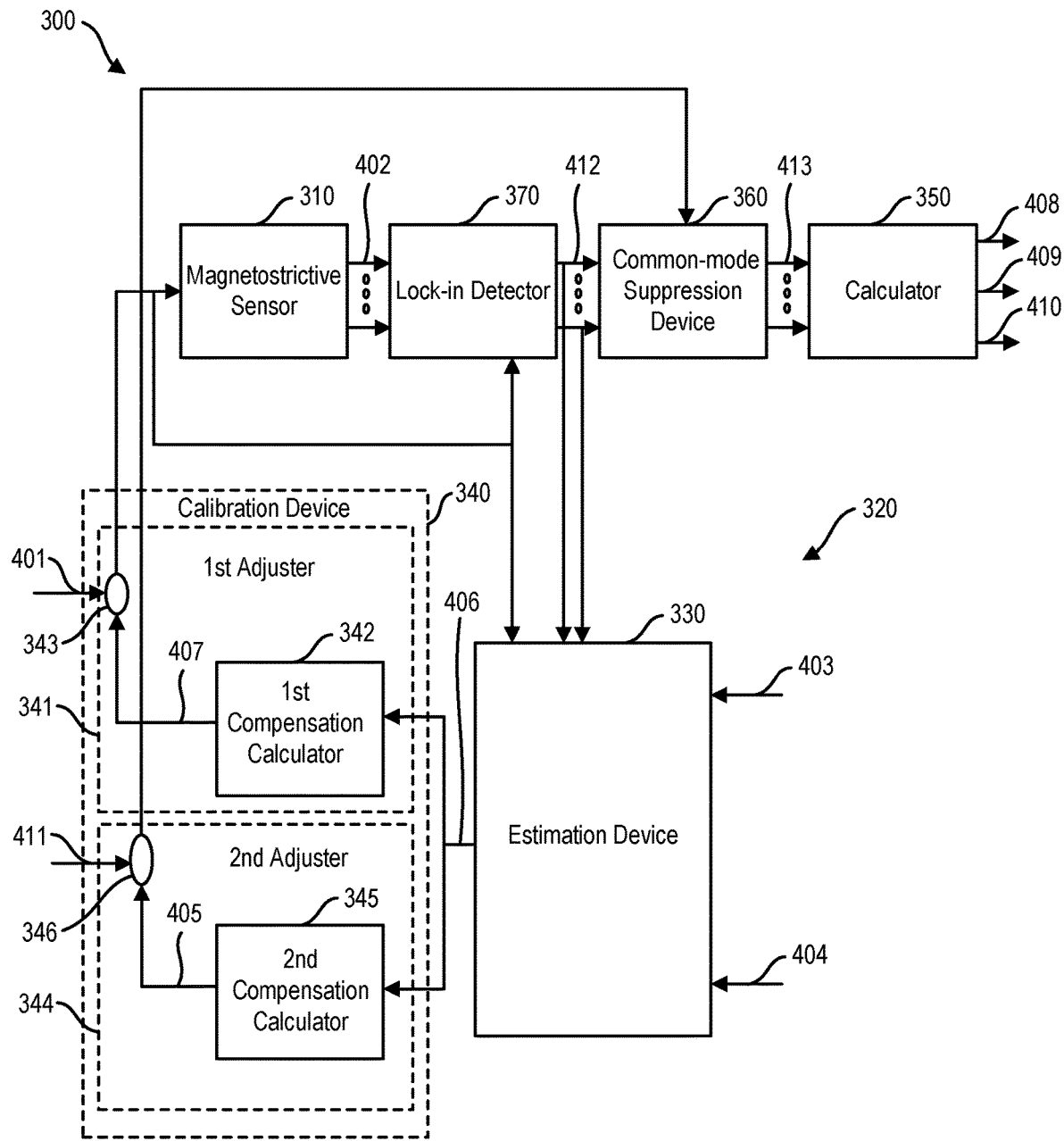
FIG. 2 is a sketch view illustrating a measuring system in accordance with another exemplary embodiment of the present disclosure.

FIG. 2 is a sketch view of a measuring system 300 in accordance with another exemplary embodiment of the present disclosure. Referring to FIG. 2, the measuring system 300 comprises a magnetostrictive sensor 310, a calibration apparatus 320, a calculator 350 and a lock-in detector 370, which are similar to the corresponding component of the system 100.

The magnetostrictive sensor 310 is positioned adjacent to an object and comprises a plurality of sensing elements (not shown) outputting a plurality of output signals 402 respectively. There is a gap between each sensing element and the object. Each output signal comprises a common-mode part, which will introduce errors into a measured result which comprises at least one of a torque, a stress and a rotation speed of the object.

The lock-in detector 370 is configured to receive an excitation signal 401 and the output signals 402 of the magnetostrictive sensor and detect an impedance 412 of each output signal. The impedance used herein refers to a phase and an amplitude of the output signal.

The measuring system 300 further comprises a common-mode suppression device 360. The common-mode suppression device 360 receives a common-mode suppression signal 411 and is configured to suppress the common-mode parts in the plurality of the output signals based on the common-mode suppression signal 411. The common-mode suppression signal 411 may comprise scaling factors and offsets added to the output signals. In the embodiment illustrated in FIG. 2, the common-mode suppression device 360 receives the impedances 412 of the output signals from the lock-in detector 370 and outputs processed output signals 413 which are free of common-mode signal.

The calculator 350 is configured to calculate at least one of a stress 408, a torque 409 and a rotation speed 410 of the object based on the output signals 402. In the embodiment shown in FIG. 2, the calculator 350 receives the processed output signals 413 and outputs the stress 408, the torque 409 and the rotation speed 410 of the object.

The calibration apparatus 320 comprises an estimation device 330 and a calibration device 340. The estimation device 330 is configured to estimate at least one of the temperature and the gaps based on the excitation signal 401 and the output signals 402 of the magnetostrictive sensor 310, and geometric information of the object and the magnetostrictive sensor 403, 404, to obtain at least one of an estimated temperature and estimated gaps 406. The geometric information of the magnetostrictive sensor 404 comprises an amount and arrangement of the sensing elements, and a size and a shape of each sensing element. In the embodiment shown in FIG. 2, the estimation device 330 receives the excitation signal 401, the impedance of the output signals 412 and the geometric information of the object and the magnetostrictive sensor 403, 404, and outputs the at least one of the estimated temperature and the estimated gaps 406.

The calibrator 340 is configured to reduce or even eliminate an effect on the output signal imposed by variations in the at least one of the gaps and the temperature, based on the at least one of the estimated gaps and the estimated temperature 406, to obtain a calibrated output signal.

Specifically, the calibrator 340 comprises a first adjuster 341 and a second adjuster 344. The first adjuster 341 is configured to adjust the excitation signal 401 based on the at least one of the estimated gaps and the estimated temperature 406. The first adjuster 341 comprises a first compensation calculator 342 and a first compensator 343, which have similar functions as the first compensation calculator 141 and the first compensator 142 illustrated in FIG. 1, and descriptions of which will not be repeated here.

The second adjuster 344 is configured to adjust the common-mode suppression signal 411 based on the at least one of the estimated gaps and the estimated temperature 406.

The second adjuster 344 comprises a second compensation calculator 345 and a second compensator 346. The second compensation calculator 345 is configured to calculate a common-mode suppression signal compensation 405 based on the at least one of the estimated gap and the estimated temperature 406. The second compensator is configured to compensate the common-mode suppression signal 411 according to the common-mode suppression signal compensation 405, to obtain a calibrated common-mode suppression signal. Then, the common-mode suppression device 360 suppresses the common-mode part of the plurality of the output signals based on the calibrated common-mode suppression signal. Each of the first and second compensator may comprise an adder or a subtractor.

Figure 3:
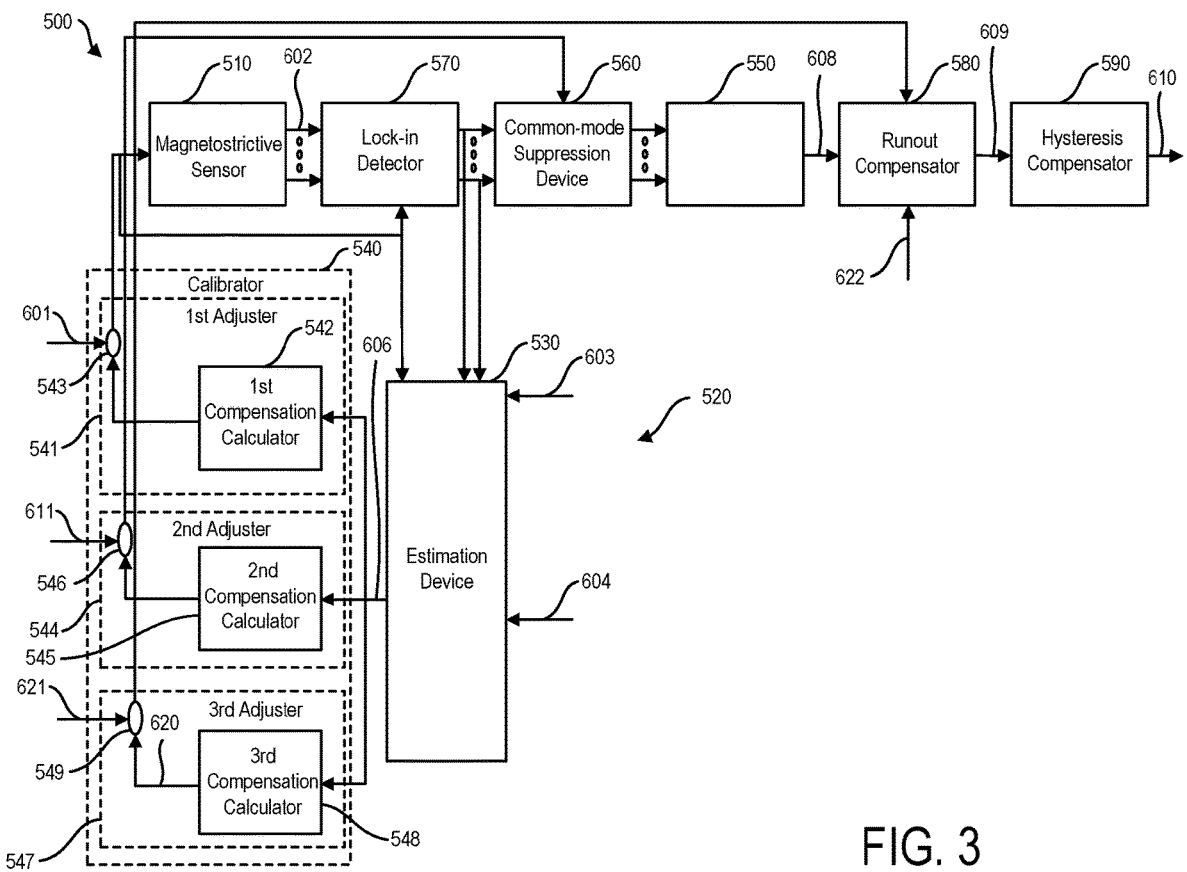
FIG. 3 is a sketch view illustrating a measuring system in accordance with another exemplary embodiment of the present disclosure.

FIG. 3 is a sketch view of a measuring system 500 for measuring a rotating object in accordance with another exemplary embodiment of the present disclosure. Similar to the measuring system 300 illustrated in FIG. 2, the measuring system 500 comprises a magnetostrictive sensor 510 positioned adjacent to the rotating object and comprising a plurality of sensing elements. There is a gap between each sensing elements and the object. The measuring system 500 also comprises a lock-in detector 570, a common-mode suppression device 560, and a calculator 550, which are similar to the corresponding components of the measuring system 300 and descriptions thereof will not be repeated here.

The measuring system 500 further comprises a runout compensator 580 for reducing or even eliminating an effect of runout on a measured result 608, wherein the measured result 608 comprises at least one of a torque, a stress and a rotation speed. The runout used herein refers to a sum of variations of surface hardness, surface roughness, residual stress and other sources causing inhomogeneity in electromagnetic property in a case of zero torque. The runout may vary with the rotating of the object, and a relation between the runout and a shaft angular location (indicating an instantaneous rotating location of the object) is referred to as a runout model 621. Referring to FIG. 3, the runout compensator 580 is coupled with the calculator 550 for calibrating the measured result 608 according to the runout model 621 and the shaft angular location 622, to obtain a first calibrated measured result 609. In some embodiments, the runout compensator 580 is configured to calibrate the measured result in real time, according to the runout model and a real time shaft angular location of the object.

The measuring system 500 further comprises a hysteresis compensator 590 for reducing or eliminating hysteresis effect on the measured result 608. In the embodiment shown in FIG. 3, the hysteresis compensator 590 is coupled with the runout compensator 580 for reducing or eliminating hysteresis effect on the first calibrated measured result 609 to obtain a second calibrated measured result 610.

The calibration apparatus 520 comprises an estimation device 530 and a calibrator 540. Similar to the estimation device 330 of the measuring system 300, the estimation device 530 is configured to estimate at least one of the gaps and a temperature of the object, based on an excitation signal 601 and output signals 602 of the magnetostrictive sensor 510, and geometric information of the object and the magnetostrictive sensor 603, 604, to obtain at least one of an estimated temperature and estimated gaps 606.

The calibrator 540 comprises a first adjuster 541 and a second adjuster 544. The first adjuster 541 comprises a first compensation calculator 542 and a first compensator 543. The second adjuster 544 comprises a second compensation calculator 545 and a second compensator 546. The first compensation calculator 542, the first compensator 543, the second compensation calculator 545 and the second compensator 546 are similar to the corresponding components of the measuring system 300, and descriptions thereof will not be repeated here.

The calibrator 540 further comprises a third adjuster 547 for adjusting the runout model 621 inputted into the runout compensator 580. The third adjuster 547 comprises a third compensation calculator 548 and a third compensator 549. The third compensation calculator 548 is configured to calculate a runout model compensation 620 based on at least one of the estimated temperature and the estimated gaps 606. The third compensator 549 is configured to compensate the runout model 621 according to the runout model compensation 620 to obtain a calibrated runout model. Then the runout compensator 580 calibrates the measured result based on the calibrated runout model.

In some embodiments, the object is a drive shaft of a machine such as an electric drive train and a turbomachinery. The torque and the rotation speed of the object may also be estimated based on some machine signals to obtain an estimated result, wherein the machine signals comprise electrical current or voltage signals from the electric drive train, or pressure or temperature signals from the turbomachinery. The measured result from the measuring system can be compared with the estimated result based on the machine signals. If a difference between the two results is higher than a preset threshold value, the magnetostrictive sensor may be replaced, or algorithm of at least one of the estimation device, the adjusters, the common-mode suppression device and the calculator may be adjusted.

Embodiments of the present disclosure also refer to a method for calibrating a magnetostrictive sensor, where in the magnetostrictive sensor is configured to measure at least one of a stress, a torque and a rotation speed of an object. The method is able to estimate a magnetic gap and a temperature of the object rather than measure them directly, in such a manner that system design can be simplified and a measuring speed can be increased.

Figure 4:
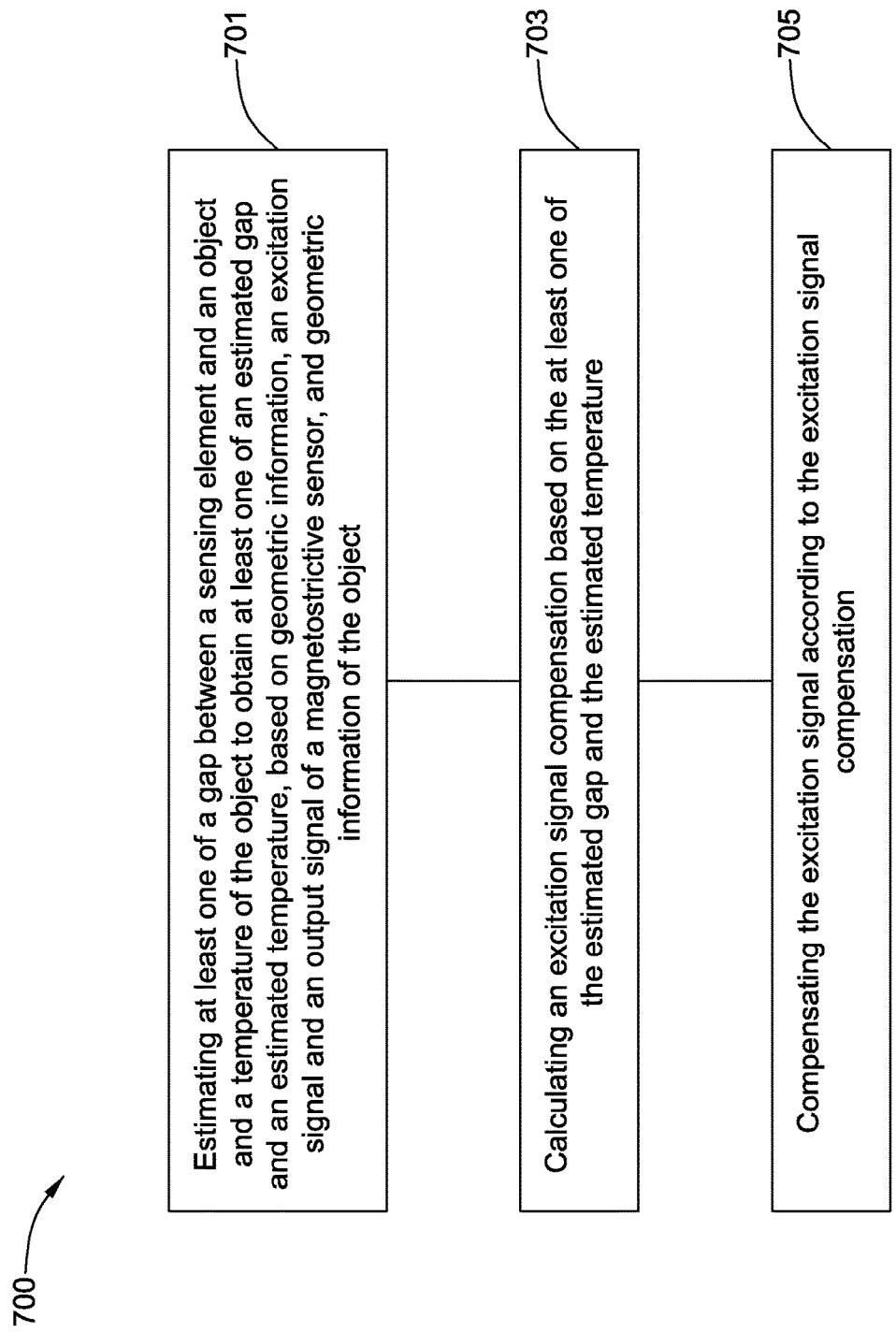
FIG. 4 is a flowchart illustrating a calibration method for calibrating a magnetostrictive sensor in accordance with an exemplary embodiment of the present disclosure.

FIG. 4 is a flowchart illustrating a method 700 for calibrating a magnetostrictive sensor in accordance with an exemplary embodiment of the present disclosure. The magnetostrictive sensor is configured to measure an object. The magnetostrictive sensor comprises a sensing element adjacent to the object. Referring to FIG. 4, the method 700 comprises step 701 to step 705.

In step 701, at least one of a gap between the sensing element and the object and a temperature of the object is estimated to obtain at least one of an estimated gap and an estimated temperature, based on geometric information, an excitation signal and an output signal of the magnetostrictive sensor, and geometric information of the object. In some embodiments, the at least one of the gap and the temperature is estimated based on an algorithm. The algorithm may comprise a linear model, a nonlinear model, a physical model-based algorithm, a data-driven algorithm, or any combination thereof. The algorithm may comprise an optimal regression model, a neural network based model, an inversed physical model, an extended kalman filter (EKF), an unscented kalman filter (UKF), or any combination thereof.

Steps 703-705 relate to reducing an effect on the output signal of the magnetostrictive sensor imposed by variations in the at least one of the gap and the temperature based on the at least one of the estimated gap and the estimated temperature, to obtain a calibrated output signal. In some embodiments, the effect can be reduced by adjusting the excitation signal based on the at least one of the estimated gap and the estimated temperature. Specifically, the adjusting the excitation signal comprises step 703 and step 705.

In step 703, an excitation signal compensation is calculated based on the at least one of the estimated gap and the estimated temperature.

In step 705, the excitation signal is compensated according to the excitation signal compensation.

In some embodiment, the magnetostrictive sensor comprises a plurality of sensing elements, which output a plurality of output signals respectively. Each of the output signals comprises a common-mode part, which will introduce errors into the measured result. Therefore, the calibrating method may comprise a step of suppressing the common-mode parts of the plurality of output signals based on a common-mode suppression signal. The calibrating method may further comprise a step of reducing a runout effect on the measured result based on a runout model and a shaft angular location.

Figure 5:
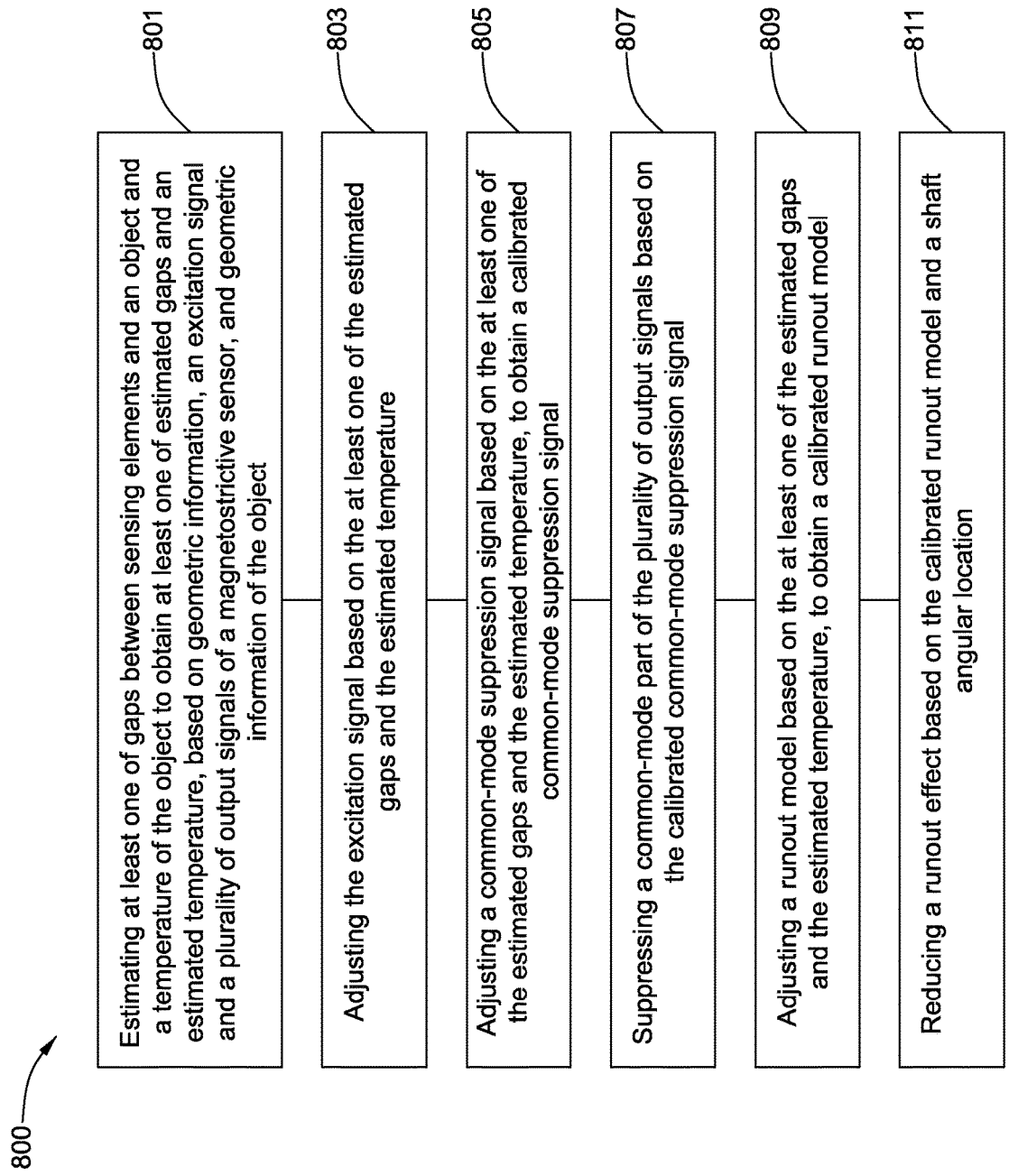
FIG. 5 is a flowchart illustrating a calibration method for calibrating a magnetostrictive sensor in accordance with another exemplary embodiment of the present disclosure.

FIG. 5 shows a flowchart of a calibration method 800 for calibrating a magnetostrictive sensor in accordance with the above-mentioned embodiments. While actions of the method are illustrated as functional blocks, the order of the blocks and the separation of the actions among the various blocks shown in FIG. 5 are not intended to be limiting. For example, the blocks may be performed in a different order and an action associated with one block may be combined with one or more other blocks or may be sub-divided into a number of blocks.

As mentioned above, the magnetostrictive sensor comprises the plurality of sensing elements. The magnetostrictive sensor is positioned adjacent to an object with a gap between each sensing element and the object, and each of the sensing elements outputs an output signal. Referring to FIG. 5, the calibration method 800 comprises step 801 to step 811.

In step 801, at least one of the gaps and a temperature of the object are estimated to obtain at least one of estimated gaps and an estimated temperature, based on geometric information, an excitation signal and the plurality of output signals of the magnetostrictive sensor, and geometric information of the object.

In step 803, the excitation signal is adjusted based on the at least one of the estimated gaps and the estimated temperature, in order to reduce an effect on the output signals imposed by variations in the at least one of the gaps and the temperature. In some embodiments, the adjusting the excitation signal comprises calculating an excitation signal compensation based on the at least one of the estimated gaps and the estimated temperature, and compensating the excitation signal according to the excitation signal compensation.

In step 805, the common-mode suppression signal is adjusted based on the at least one of the estimated gaps and the estimated temperature to obtained a calibrated common-mode suppression signal. In some embodiments, the adjusting the common-mode suppression signal comprises calculating a common-mode suppression signal compensation based on the at least one of the estimated gaps and the estimated temperature, and compensating the common-mode suppression signal according to the common-mode suppression signal compensation.

Step 807 relates to suppressing the common-mode part of the plurality of output signals based on the calibrated common-mode suppression signal.

In step 809, the runout model is adjusted based on the at least one of the estimated gaps and the estimated temperature to obtain a calibrated runout model. In some embodiments, the adjustment of the runout model comprises calculating a runout model compensation based on the at least one of the estimated gaps and the estimated temperature, and compensating the runout model according to the runout model compensation.

Step 811 relates to reducing the runout effect based on the calibrated runout model and the shaft angular location.

Details of the methods may be similar to these of the processes described herein above in conjunction with the measuring system, and will not be repeated.

As will be understood by those familiar with the art, the present disclosure may be embodied in other specific forms without depending from the spirit or essential characteristics thereof. Accordingly, the disclosures and descriptions herein are intended to be illustrative, but not limiting, of the scope of the disclosure which is set forth in the following claims.

The invention claimed is:

1. A calibration apparatus for calibrating a magnetostrictive sensor, which is configured to measure an object and comprises a sensing element positioned adjacent to the object, the calibration apparatus comprising:
   an estimation device, including a data processor, for estimating at least one of a gap between the sensing element and the object and a temperature of the object to obtain at least one of an estimated gap and an estimated temperature, based on geometric information of the magnetostrictive sensor, an excitation signal and an output signal of the magnetostrictive sensor, and geometric information of the object; and
   a calibrator for reducing an effect on the output signal of the magnetostrictive sensor imposed by variations in the at least one of the gap and the temperature based on the at least one of the estimated gap and the estimated temperature, to obtain a calibrated output signal.

2. The calibration apparatus according to claim 1, wherein the calibrator comprises a first adjuster for adjusting the excitation signal based on the at least one of the estimated gap and the estimated temperature.

3. The calibration apparatus according to claim 2, wherein the first adjuster comprises:
   a first compensation calculator for calculating an excitation signal compensation based on the at least one of the estimated gap and the estimated temperature; and
   a first compensator for compensating the excitation signal according to the excitation signal compensation.

4. The calibration apparatus according to claim 1, wherein the magnetostrictive sensor comprises a plurality of sensing elements which output a plurality of output signals respectively, the estimation device is configured to estimate at least one of gaps between the sensing elements and the object and the temperature of the object to obtain at least one of estimated gaps and the estimated temperature, and the calibration apparatus further comprises a common-mode suppression device for suppressing a common-mode part of the plurality of output signals based on a common-mode suppression signal.

5. The calibration apparatus according to claim 4, wherein the calibrator comprises a second adjuster for adjusting the common-mode suppression signal based on the at least one of the estimated gaps and the estimated temperature.

6. The calibration apparatus according to claim 5, wherein the second adjuster comprises:
   a second compensation calculator for calculating a common-mode suppression signal compensation based on the at least one of the estimated gaps and the estimated temperature; and
   a second compensator for compensating the common-mode suppression signal according to the common-mode suppression signal compensation.

7. The calibration apparatus according to claim 1, wherein the estimation device is configured to estimate the at least one of the gap and the temperature based on an algorithm, and the algorithm comprises a linear model, a nonlinear model, a physical model-based algorithm, a data-driven algorithm, or any combination thereof.

8. The calibration apparatus according to claim 1, wherein the estimation device is configured to estimate the at least one of the gap and the temperature based on an algorithm, and the algorithm comprises an optimal regression model, a neural network based model, an inversed physical model, an extended kalman filter (EKF), an unscented kalman filter (UKF), or any combination thereof.

9. A measuring system for measuring an object, comprising:
   a magnetostrictive sensor comprising a sensing element positioned adjacent to the object;
   an estimation device, including a data processor, for estimating at least one of a gap between the sensing element and the object and a temperature of the object to obtain at least one of an estimated gap and an estimated temperature, based on geometric information of the magnetostrictive sensor, an excitation signal and an output signal of the magnetostrictive sensor, and geometric information of the object;
   a calibrator for reducing an effect on the output signal of the magnetostrictive sensor imposed by variations in the at least one of the gap and the temperature based on the at least one of the estimated gap and the estimated temperature, to obtain a calibrated output signal; and
   a calculator for calculating at least one of a stress, a torque and a rotation speed of the object, based on the calibrated output signal.

10. The measuring system according to claim 9, wherein the estimation device is configured to estimate the at least one of the gap and the temperature based on an algorithm, and the algorithm comprises a linear model, a nonlinear model, a physical model-based algorithm, a data-driven algorithm, or any combination thereof.

11. The measuring system according to claim 9, wherein the estimation device is configured to estimate the at least one of the gap and the temperature based on an algorithm, and the algorithm comprises an optimal regression model, a neural network based model, an inversed physical model, an extended kalman filter (EKF), an unscented kalman filter (UKF), or any combination thereof.

12. A calibration method for calibrating a magnetostrictive sensor, which is configured to measure an object and comprises a sensing element adjacent to the object, the calibration method comprising:
   estimating at least one of a gap between the sensing element and the object and a temperature of the object to obtain at least one of an estimated gap and an estimated temperature, based on geometric information of the magnetostrictive sensor, an excitation signal and an output signal of the magnetostrictive sensor, and geometric information of the object; and
   reducing an effect on the output signal of the magnetostrictive sensor imposed by variations in the at least one of the gap and the temperature based on the at least one of the estimated gap and the estimated temperature, to obtain a calibrated output signal.

13. The calibration method according to claim 12, wherein the reducing the effect comprises adjusting the excitation signal based on the at least one of the estimated gap and the estimated temperature.

14. The calibration method according to claim 13, wherein the adjusting the excitation signal comprises:
   calculating an excitation signal compensation based on the at least one of the estimated gap and the estimated temperature; and
   compensating the excitation signal according to the excitation signal compensation.

15. The calibration method according to claim 12, wherein the magnetostrictive sensor comprises a plurality of sensing elements which output a plurality of output signals respectively, the step of estimating comprises estimating at least one of gaps between the plurality of sensing elements and the object and the temperature of the object to obtain at least one of estimated gaps and the estimated temperature, and the method further comprises suppressing a common-mode part of the plurality of output signals based on a common-mode suppression signal.

16. The calibration method according to claim 15, wherein the reducing the effect comprises adjusting the common-mode suppression signal based on the at least one of the estimated gaps and the estimated temperature.

17. The calibration method according to claim 16, wherein the adjusting the common mode suppression signal comprises:
   calculating a common-mode suppression signal compensation based on the at least one of the estimated gaps and the estimated temperature; and
   compensating the common-mode suppression signal according to the common mode suppression signal compensation.

18. The calibration method according to claim 12, wherein the estimating comprises estimating the at least one of the gap and the temperature based on an algorithm, and the algorithm comprises a linear model, a nonlinear model, a physical model-based algorithm, a data-driven algorithm, or any combination thereof.

19. The calibration method according to claim 12, wherein the estimating comprises estimating the at least one of the gap and the temperature based on an algorithm, and the algorithm comprises an optimal regression model, a neural network based model, an inversed physical model, an extended kalman filter (EKF), an unscented kalman filter (UKF), or any combination thereof.

* * * * *